United States Patent

Herbst et al.

[11] Patent Number: 5,805,032
[45] Date of Patent: Sep. 8, 1998

[54] ELECTRICAL FILTER FOR ATTENUATING OSCILLATIONS IN AC MAINS

[75] Inventors: Werner Herbst, Niederweningen, Switzerland; Thomas Kirsten, Lauchringen, Germany

[73] Assignee: Asea Brown Boveri AG, Baden, Switzerland

[21] Appl. No.: 762,412

[22] Filed: Dec. 9, 1996

[30] Foreign Application Priority Data

Dec. 22, 1995 [DE] Germany .................. 195 47 969.6

[51] Int. Cl.⁶ .................................................. H03H 7/06
[52] U.S. Cl. .......................... 333/181; 333/176; 307/105; 363/47
[58] Field of Search .................. 333/175, 176, 333/181; 307/105; 363/47

[56] References Cited

U.S. PATENT DOCUMENTS

| | | | |
|---|---|---|---|
| 3,881,137 | 4/1975 | Thanawala | 333/175 X |
| 5,260,862 | 11/1993 | Marsh | 333/176 X |
| 5,619,080 | 4/1997 | Pennington et al. | 333/176 X |

FOREIGN PATENT DOCUMENTS 507254  5/1952  Belgium ................................ 363/47

OTHER PUBLICATIONS

"Robuste Filter in der Energieversorgung", Forsyth, et al., etz. Bd. 114 (1993), pp. 1382–1385.

*Primary Examiner*—Robert J. Pascal
*Assistant Examiner*—Justin P. Bettendorf
*Attorney, Agent, or Firm*—Burns, Doane, Swecker & Mathis, L.L.P.

[57] ABSTRACT

In order to avoid filter excitations of subharmonics or intermediate harmonics, that is to say of oscillations in the frequency range between integral harmonics of the mains frequency ($f_N$), in the case of an attenuation resistor (R1, R3, R3') in parallel with a series resonant circuit comprising a filter inductor (L1, L3) in series with a filter capacitor (C1, C31, C31'), the resistance is dimensioned in such a way that a current gain of the filter (F1–F3) at its frequency pole points with an AC mains (1) is not greater than 6-fold. Double low-pass filters (F1, F2) and high-pass filters (F3) with attenuation resistors (R1, R3, R3') are particularly suitable as filters (F1, F3).

6 Claims, 2 Drawing Sheets

5,805,032

ELECTRICAL FILTER FOR ATTENUATING OSCILLATIONS IN AC MAINS

BACKGROUND OF THE INVENTION

Field of the Invention

The invention is based on an electrical filter for attenuating electrical oscillation.

DISCUSSION OF BACKGROUND

With the preamble of patent claim 1, the invention refers to a prior art as is disclosed in the German periodical etz, Volume 114 (1993), Issue 22, pp. 1382–1385. The latter reference specifies tuned high-pass filters with resistive attenuation for reducing the harmonics content in three-phase mains supplies, which filters react insensitively to tolerances of the filters or of the mains supply. The resistive damping enables the influence of transient harmonics of the kind produced, for example, when switching on transformers, rotary machines or capacitor banks to be reduced. The greater the resistive attenuation is, that is to say the lower the non-reactive resistance in parallel with the inductance of a series resonant circuit is, the smaller the impedance maximum becomes in the case of parallel resonance. In order to minimize the losses at the mains frequency, the filter can have a rejector circuit in parallel with the attenuation resistor. More precise details on the dimensioning of the resistive attenuation are lacking.

SUMMARY OF THE INVENTION

Accordingly, one object achieved by the invention is to develop an electrical filter of the type mentioned in the introduction further in such a way that filter excitations of subharmonics or intermediate harmonics, that is to say of oscillations in the frequency range between integral harmonics of the mains frequency, are avoided.

Advantageous refinements of the invention are defined in the dependent patent claims.

One advantage of the invention consists in the fact that, given the presence of an exciting current source, for example an arc furnace, having approximately the same frequency as that of an undesired intermediate harmonic, the resulting gain due to the filter is small enough for any feedback to a current regulating circuit for a current source of this type to remain within tolerable limits. Mains voltage distortion on a busbar to which the filter is connected can be kept within limit values which are predetermined by electricity supply companies.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
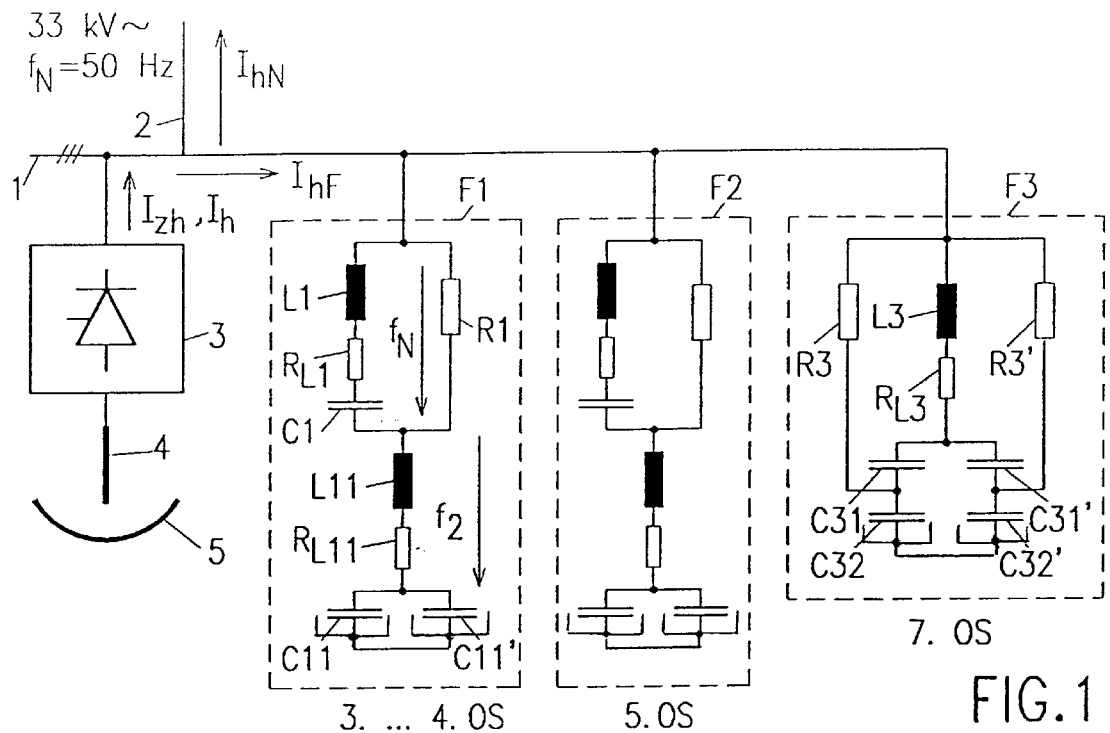
FIG. 1 shows an AC mains with electrical filters and a DC arc furnace connected via a rectifier.

Referring now to the drawings, wherein like reference numerals designate identical or corresponding parts throughout the several views, FIG. 1 shows a DC arc furnace (5) having a cathode or DC electrode (4), which is fed with a direct current by a converter or rectifier (3). On the AC side, the rectifier (3) is connected to a 3-phase AC mains (1) having a mains frequency ($f_N$) of 50 Hz (or 60 Hz) and a medium voltage in the range from 10 kV–50 kV, for example of 33 kV. This AC mains (1) is connected via a connection line (2) to a superordinate alternating voltage power supply (not illustrated) having a high voltage in the range from 110 kV–230 kV.

During operation, the rectifier (3) excites interfering harmonics, in particular of the orders $n=k \cdot p \pm 1$, where p=pulse number of the rectifier (3) and k=1, 2, 3, ... integral. The DC arc furnace (5) is permanently in a transient operating state, which the rectifier (3) attempts largely to keep away from the AC mains (1) by means of quasi-stable operation. Possible excitations from the AC mains (1) interfere with this operating state in that they cause a build-up of intermediate harmonics between these harmonics and can lead to impermissible mains flicker. Electrical filters (F1–F3) prevent this build-up and thus avoid impermissible mains flicker.

Figure 2:
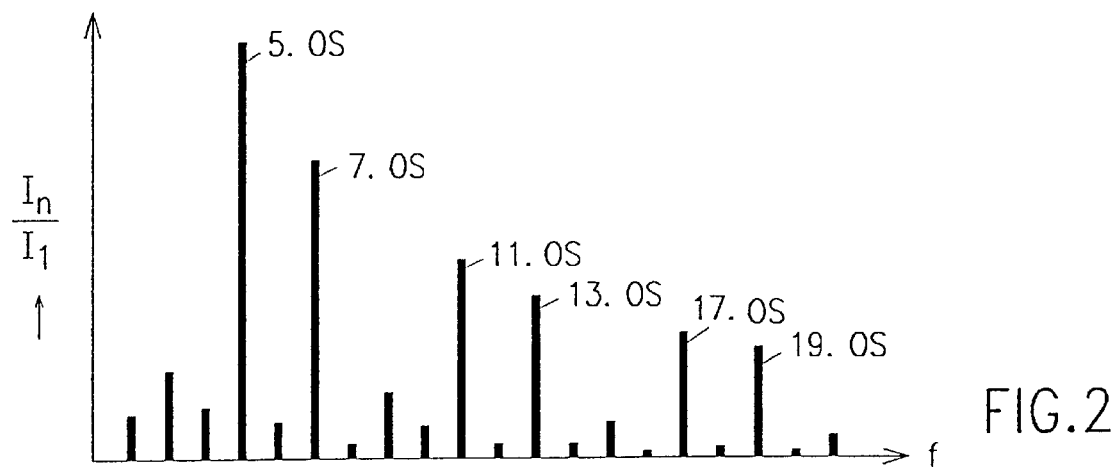
FIG. 2 shows a typical current spectrum for DC operation of the rectifier according to FIG. 1.

In FIG. 2, the ratio of the harmonic current ($I_n$) of the order (n) to the current ($I_1$) at the fundamental frequency or mains frequency ($f_N$) is plotted on the ordinate and the frequency (f) for a 6-pulse rectifier (3) and without filters (F1–F3) is plotted on the abscissa. It is evident that the characteristic harmonics of the 3rd, 7th, 11th, 13th, 17th and 19th order of the converter (3) yield particularly large amplutides.

In order largely to eliminate mains excitations of intermediate harmonics, electrical filters (F1–F3) are connected to the AC mains (1). A double low-pass filter (F1) produces with the inductance of the AC mains (1) parallel resonance at a frequency (f1), cf. FIG. 4, which is not an integral multiple of the mains frequency ($f_N$). All of the frequency pole points of a filter (F1–F3) must be attenuated in such a way that, given the presence of a current source exciting these pole points, such as, for example, of a rectifier (3) and/or of a DC arc furnace (5), the resulting gain is so small that it is not possible for any negative effects to occur on the feedback of current regulating circuits for the rectifier (3). A resulting gain due to a filter (F1–F3) must not lead to an impermissible mains voltage distortion at the AC mains (1), the limit value of which distortion is predetermined by mains voltage operating companies. This current gain of the intermediate harmonics in the mains current ($I_h$) should not be greater than 6-fold, and should preferably be in the range from 3-fold to 5-fold.

The pole point at the lowest frequency (f1) usually leads to the excitation of mains flicker, so that above all the attenuation of this pole point is important. The attenuation is effected by an attenuation resistor (R1), which is usually designed for power losses in the range of from a few kilowatts–100 kW.

The double low-pass filter (F1) comprises 2 1st and 2nd filters connected in series. The 1st of these 2 filters comprises a 1st filter inductor (L1) in a series circuit with a 1st filter capacitor (C1), with which series circuit the attenuation resistor (R1) is connected in parallel; it is tuned to the mains frequency ($f_N$). The 2nd of these 2 filters comprises a 2nd filter inductor (L11) in a series circuit with 2 2nd and 3rd converter capacitors (C11, C11'), which are connected in parallel with one another; it is tuned to a 2nd predeterminable frequency ($f_2$), at which the filter impedance (Z) has a minimum. This frequency ($f_2$) must not be a harmonic of the mains frequency ($f_N$). ($R_{L1}$) and ($R_{L11}$) designate non-reactive resistances of the 1st and 2nd filter inductors (L1) and (L11), respectively.

In terms of circuitry, a 2nd double low-pass filter (F2) connected to the AC mains (1) is constructed identically to the double low-pass filter (F1), but is designed for the attenuation, for instance, of the 5th harmonic (OS).

A high-pass filter (F3) connected to the AC mains (1) and having 2 attenuation resistors (R3, R3') serves for the attenuation, for instance, of the 7th harmonic. This has a 1st capacitor series circuit with 1st and 2nd filter capacitors (C31, C32) and, connected in parallel therewith, a 2nd capacitor series circuit with 3rd and 4th filter capacitors (C31', C32'), with which parallel circuit a filter inductor (L3) is connected in series. An attenuation resistor (R3) is connected in a parallel circuit with respect to the series circuit formed by the filter inductor (L3) and the first filter capacitor (C31) of this 1st capacitor series circuit. An attenuation resistor (R3') is connected in a further parallel circuit with respect to the series circuit formed by the filter inductor (L3) and the 1st filter capacitor (C31') of this 2nd capacitor series circuit. ($R_{L3}$) designates the non-reactive resistance of the filter inductor (L3). This high-pass filter (F3) enables the power loss in the attenuation resistors (R3, R3') to be considerably reduced compared with otherwise customary filters having only one attenuation resistor.

It goes without saying that all of the filters (F1–F3) may be of the same type (F1, F2) or (F3).

A mains current ($I_{hN}$) of the harmonics at the characteristic frequency of the rectifier (3) is composed of a rectifier current ($I_{zh}$) of intermediate harmonics which stem from the arc furnace (5) and of harmonics ($I_h$) at the characteristic frequency of the rectifier (3), without the influence of the impedance of the filters (F1–F3), reduced by a filter current ($I_{hF}$).

Figure 3:
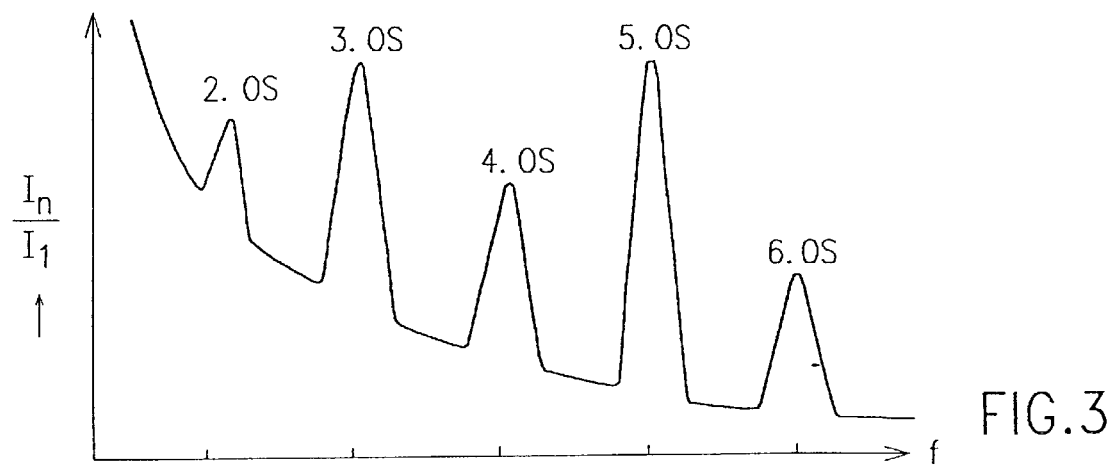
FIG. 3 shows a typical current spectrum for AC operation of an AC arc furnace.

FIG. 3 shows a typical spectrum of an AC arc furnace (not illustrated), without filters (F1–F3) and without a rectifier (3), according to FIG. 1. The ordinate and abscissa designations correspond to those in FIG. 2. In this case, the harmonics are generated in a continuous spectrum, caused by the unstable operational performance of its 3 arcs. The integral harmonics have pronounced peak values which are accompanied by contiguous sidebands having smaller amplitudes. Subharmonics also occur. Likewise suitable here for the attenuation are filters of the type (F1, F2) and (F3), according to FIG. 1, with pole points (f1) between each two integral harmonics.

Figure 4:
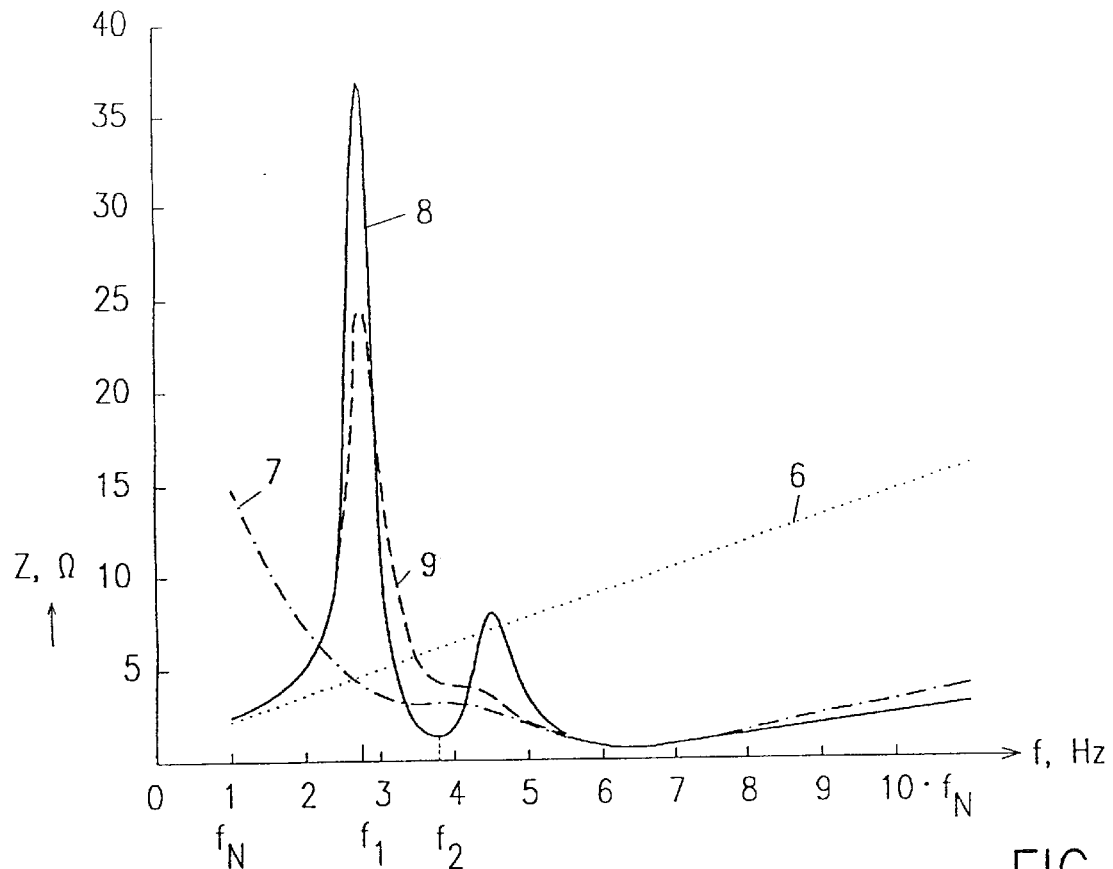
FIG. 4 shows an impedance diagram for an AC mains according to FIG. 1.

FIG. 4 shows a frequency/impedance diagram using a high-pass filter (F3) with tuning in the range between the 3rd and 4th harmonics in a circuit according to FIG. 1. In this case, the impedance (Z) in ω is specified on the ordinate and the frequency (f) in multiples of the mains frequency ($f_N$) in Hz is specified on the abscissa. A straight line (6) identifies the system impedance without filters (F1–F3). A dot-dashed curve having an identification number (7) designates the impedance profile of a filter system according to FIG. 1 using the high-pass filter (F3), tuned for a range between the 3rd and 4th harmonics. A solid curve (8) shows the impedance profile of a filter system according to FIG. 1 using a high-pass filter (F3) having an attenuation resistor R3=R3'= 180 $\doteq$, and the dashed curve (9) shows an impedance profile with an attenuation resistor R3=R3'=30 $\doteq$. The exemplary high-pass filter (F3) forms with the inductive mains impedance a lowest frequency pole point (f1) at 2.7·$f_N$ Hz; its tuning frequency (f2) is at 3.8·$f_N$ Hz.

Figure 5:
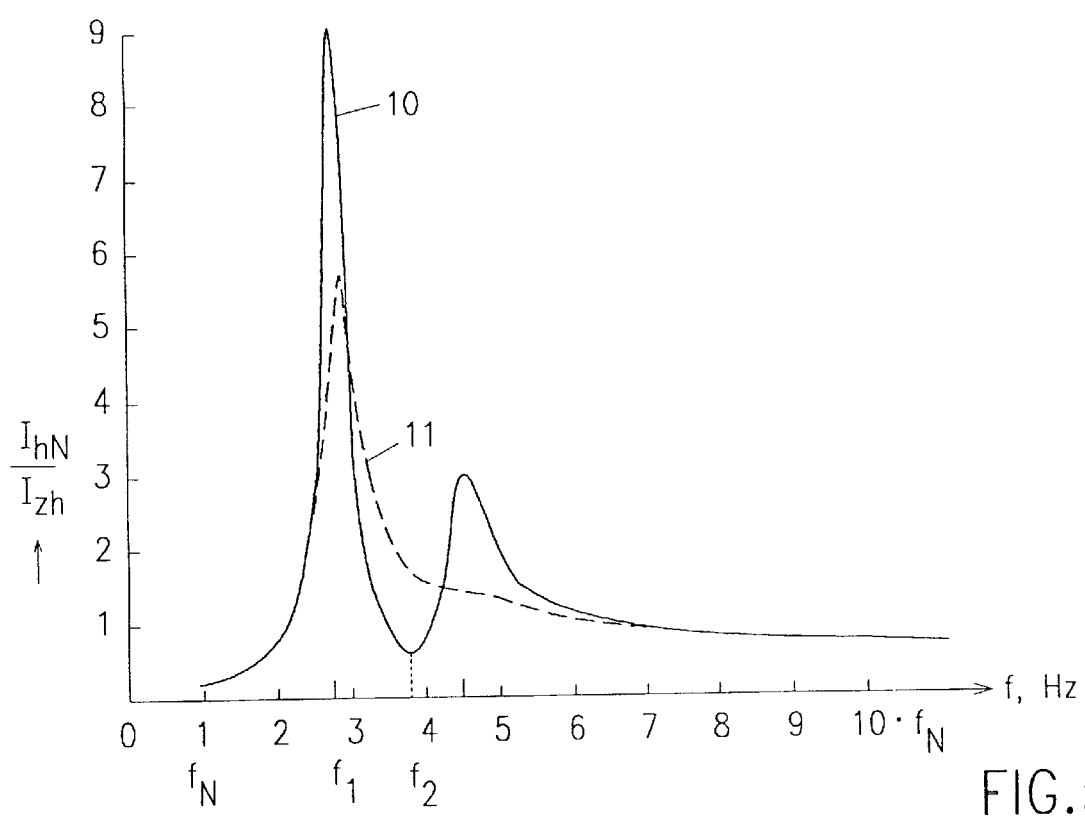
FIG. 5 shows a diagram which shows the influence of two different attenuation resistors on the gain of the mains current due to the impedance of the filters.

FIG. 5 shows a current gain due to the impedance (Z) of the filter system according to FIG. 1 using the high-pass filter (F3), corresponding to FIG. 4, the ratio of the mains current ($I_{hN}$) to the intermediate harmonic, which is fed in at the frequency (f1) of the pole point, at the characteristic frequency of the rectifier current ($I_{zh}$), taking account of the influence of the impedance of the filter system (F1–F3), being plotted on the ordinate. The abscissa values correspond to those of FIG. 4. A solid curve (10) shows the gain with an attenuation resistor R3=R3'=180 $\doteq$ and the dashed curve (11) shows a gain profile with an attenuation resistor R3=R3'=30 $\doteq$. While the curve (10) has an undesirable gain of 9 at the lowest frequency pole point (f1) at 2.7·$f_N$ Hz, a gain of 5.5 is achieved with the resistor R3=R3'=30 $\doteq$, cf. curve (11).

It is important that the attenuation resistor (R1, R3, R3') in the filters (F1–F3) is dimensioned in such a way that the gain at all of the frequency pole points is <6, the lowest frequency pole point (f1) being the most important. In this case, it is also possible to use other filters (F1–F3) with an attenuation resistor than the ones specified in FIG. 1.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An electrical filter for attenuating electrical oscillations comprising:

a) at least one 1st parallel circuit of at least one 1st non-reactive attenuation resistor;

b) in parallel with a 1st series circuit which has at least one first filter inductor in series with c) at least one 1st filter capacitor, wherein e) the resistance of the 1st attenuation resistor is dimensioned in such a way that a current gain due to the filter at its lowest frequency pole point (f1) caused by it lies in the range not greater than 6-fold, and f) the frequency (f1) of the lowest frequency pole point is not an integral multiple of a mains frequency ($f_N$) of an AC mains which is operatively connected to the filter.

2. The electrical filter as claimed in claim 1, wherein the electrical filter is a double low-pass filter.

3. The electrical filter as claimed in claim 2, wherein the double low-pass filter has, in a series circuit with respect to the 1st parallel circuit, a 2nd filter inductor in series with at least one 2nd filter capacitor.

4. The electrical filter as claimed in claim 1, wherein a) a 2nd parallel circuit of at least one 2nd non-reactive attenuation resistor b) is provided in parallel with a 2nd series circuit, which has at least the 1st filter inductor in series with c) at least one 3rd filter capacitor.

5. The electrical filter as claimed in claim 4, wherein a) the 3rd filter capacitor is connected in series with a 4th filter capacitor, b) the 1st filter capacitor is connected in series with a 5th filter capacitor, and c) the 4th and 5th filter capacitors are operatively connected to one another.

6. The electrical filter as claimed in claim 1, wherein the current gain due to the filter at its lowest frequency pole point (f1) caused by it lies in the range from 3-fold to 5fold.

* * * * *